(12) United States Patent
Yang et al.

(10) Patent No.: US 12,720,781 B2
(45) Date of Patent: Aug. 25, 2026

(54) SEMICONDUCTOR DEVICE AND RELATED CHIP AND PREPARATION METHOD

(71) Applicant: HUAWEI TECHNOLOGIES CO., LTD., Shenzhen (CN)

(72) Inventors: Wentao Yang, Dongguan (CN); Loucheng Dai, Shanghai (CN); Chaofan Song, Shanghai (CN); Boning Huang, Dongguan (CN); Zhihua Liu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 546 days.

(21) Appl. No.: 17/851,179

(22) Filed: Jun. 28, 2022

(65) Prior Publication Data

US 2022/0416063 A1 Dec. 29, 2022

(30) Foreign Application Priority Data

Jun. 28, 2021 (CN) ......................... 202110721082.9

(51) Int. Cl.

*H10D 12/00* (2025.01)
*H10D 12/01* (2025.01)
*H10D 62/10* (2025.01)

(52) U.S. Cl.

CPC ........... *H10D 12/421* (2025.01); *H10D 12/01* (2025.01); *H10D 62/127* (2025.01)

(58) Field of Classification Search

CPC ............. H01L 29/7394; H01L 29/0696; H01L 29/66325; H01L 29/167; H01L 29/32;

(Continued)

(56) References Cited

U.S. PATENT DOCUMENTS 6,524,894 B1 2/2003 Nozaki et al.
6,683,343 B2 1/2004 Matsudai et al.

(Continued)

FOREIGN PATENT DOCUMENTS

CN 101884106 A 11/2010
CN 105206516 A 12/2015

(Continued)

OTHER PUBLICATIONS

Wang et al., Insulated gate bipolar transistor and forming method thereof, 2020, machine translation of CN 111933703, pp. 1-12. (Year: 2020).*

*Primary Examiner* — Natalia A Gondarenko
(74) *Attorney, Agent, or Firm* — Rimon PC

(57) ABSTRACT

Embodiments of this application disclose a semiconductor device, a related chip, and a preparation method. The semiconductor device includes an N-type drift layer and an N-type field stop layer adjacent to the N-type drift layer. A density of free electrons at the N-type field stop layer is higher than a density of free electrons at the N-type drift layer. The N-type field stop layer includes first type impurity particles and second type impurity particles doped with the first type impurity particles, and a radius of the second type impurity particles is greater than a radius of the first type impurity particles. In the N-type field stop layer, an injection density of the first type impurity particles in a region adjacent to the N-type drift layer is higher than an injection density of the first type impurity particles in any other region.

10 Claims, 11 Drawing Sheets

(58) Field of Classification Search

CPC ............... H01L 29/36; H01L 29/66348; H01L 29/7397; H01L 29/7393; H01L 29/0603; H01L 27/0664; H01L 27/04; H01L 27/06; H01L 27/088; H01L 29/0638; H01L 29/1095; H01L 29/739; H01L 29/0834; H01L 29/8613; H01L 29/407; H01L 29/66136; H01L 21/26506; H01L 21/221; H01L 21/26513; H01L 21/266; H01L 21/324; H01L 21/2253; H01L 21/823; H10D 12/411; H10D 12/421; H10D 12/01; H10D 12/481; H10D 12/038; H10D 62/127; H10D 62/53; H10D 62/10; H10D 62/834; H10D 62/60; H10D 12/031; H10D 12/032; H10D 12/441; H10D 12/461; H10D 64/117; H10D 64/20; H10D 64/231; H10D 64/251; H10D 64/252; H10D 64/512; H10D 64/519; H10D 62/117; H10D 62/126; H10D 62/106; H10D 62/112; H10D 62/142; H10D 62/129; H10D 62/133; H10D 62/137; H10D 62/145; H10D 62/149; H10D 84/0123; H10D 84/0126; H10D 84/101; H10D 84/135; H10D 84/141; H10D 84/143; H10D 84/146; H10D 84/148; H10D 84/161; H10D 84/406; H10D 84/613; H10D 84/8312; H10D 89/601; H10D 89/611; H10D 62/154; H10D 62/155; H10D 62/177; H10D 62/292; H10D 62/393; H10P 30/204; H10P 30/208; H10P 30/212; H10P 30/218; H10P 34/00; H10P 34/10; H10P 34/40

USPC .......... 257/133, 139, 140, 329, 655, 21.334, 257/29.198

See application file for complete search history.

(56) References Cited

U.S. PATENT DOCUMENTS

| | | | |
|---|---|---|---|
| 7,538,412 B2 | 5/2009 | Schulze et al. | |
| 2008/0157117 A1* | 7/2008 | McNutt | H10D 62/126 257/E29.112 |
| 2012/0267681 A1 | 10/2012 | Nemoto et al. | |
| 2014/0342509 A1* | 11/2014 | Laschek-Enders | H01L 25/0652 438/127 |
| 2016/0197143 A1 | 7/2016 | Naito | |
| 2016/0365303 A1* | 12/2016 | Watanabe | H01L 23/3107 |
| 2017/0047408 A1 | 2/2017 | Kuribayashi et al. | |
| 2017/0278929 A1* | 9/2017 | Imagawa | H01L 21/26506 |
| 2018/0019131 A1 | 1/2018 | Suzuki et al. | |
| 2019/0288078 A1* | 9/2019 | Wakimoto | H01L 29/32 |
| 2021/0126092 A1 | 4/2021 | Kubouchi | |
| 2021/0320174 A1* | 10/2021 | Schulze | H10D 12/441 |
| 2022/0013643 A1 | 1/2022 | Agata | |

FOREIGN PATENT DOCUMENTS

| | | | |
|---|---|---|---|
| CN | 107004716 A | 8/2017 | |
| CN | 109216445 A | 1/2019 | |
| CN | 111933703 A * | 11/2020 | H10D 12/032 |
| CN | 112219263 A | 1/2021 | |
| EP | 4040501 A1 | 8/2022 | |
| JP | 2000040951 A | 2/2000 | |
| JP | 2020027921 A | 2/2020 | |
| JP | 2020043301 A | 3/2020 | |
| WO | 2021070539 A1 | 4/2021 | |

* cited by examiner

E

N-type drift region

Field stop region

SEMICONDUCTOR DEVICE AND RELATED CHIP AND PREPARATION METHOD

CROSS-REFERENCE TO RELATED APPLICATION

This application claims priority to Chinese Patent Application No. 202110721082.9, filed on Jun. 28, 2021, which is hereby incorporated by reference in its entirety.

TECHNICAL FIELD

Embodiments of this application relate to the field of semiconductor technologies, and in particular, to a semiconductor device, a related chip, and a preparation method.

BACKGROUND

An insulated gate bipolar field-effect transistor or simply insulated gate bipolar transistor (IGBT) is a composite full-control voltage-driven power semiconductor device that includes a bipolar junction transistor (BJT) and a metal-oxide-semiconductor transistor or metal-oxide-semiconductor field-effect transistor (MOSFET). The BJT has a low saturation voltage drop and a high current carrying capacity, but has a large drive current. The MOSFET has a low drive power and a high switching speed, but has a high on-state voltage drop and a low current carrying capacity. The IGBT integrates advantages of the MOSFET and the BJT, and has advantages such as high input impedance, a high switching speed, good thermal stability, a simple drive circuit, a small drive current, a low saturation voltage drop, high voltage resistance, and a high current carrying capacity. Therefore, the IGBT is applicable to a converter system with a 600 V or higher direct current voltage, for example, fields such as an alternating current motor, a frequency converter, a switching power supply, a lighting circuit, and traction and transmission.

In comparison with a non-punch-through IGBT (namely, an NPT-IGBT), an N-type field stop layer (which is also referred to as an N-type buffer layer) is added to a back surface of an IGBT (namely, an FS-IGBT) having a field stop layer, and a doping density of the N-type field stop layer is slightly greater than a doping density of a substrate of the FS-IGBT. In this case, strength of an electric field may be quickly reduced, so that the overall electric field is trapezoidal, to stop the electric field and greatly reduce a required thickness of an N-type drift region. In addition, the N-type field stop layer may be further used to adjust transmit efficiency of an emitter, to improve a tailing current and a loss that exist when the IGBT is turned off.

In conventional technologies, a width of the field stop layer can be increased by forming the field stop layer through proton (H+) injection or the like. However, a corresponding IGBT generates a peak voltage with a high frequency, a very high amplitude, and a very narrow width in a circuit with a large parasitic inductance, and it is likely to cause the IGBT itself or other components in the circuit to be broken down and damaged due to overvoltage.

SUMMARY

Embodiments of this application provide a semiconductor device, a related chip, and a preparation method, so as to alleviate a situation in which a semiconductor device in which a field stop layer is formed through proton (H+) injection generates an excessively high peak voltage in a circuit with a large parasitic inductance.

A first aspect of embodiments of this application provides a semiconductor device, where the semiconductor device includes an N-type drift layer and an N-type field stop layer adjacent to the N-type drift layer.

In an IGBT, a density of free electrons at the field stop layer is higher than a density of free electrons at the N-type drift layer, so that electric field strength may be rapidly reduced and the entire electric field may be trapezoidal, thereby quickly stopping the electric field. A field stop region may be formed by doping two kinds of impurity particles, where a radius of a first type impurity particles is smaller than a radius of a second type impurity particles, and an injection density of the first type impurity particles in a region adjacent to the N-type drift layer is higher than an injection density of the first type impurity particles in any other region.

In the foregoing semiconductor, the field stop layer is formed by doping the first type impurity particles and the second type impurity particles. Due to the first type impurity particles having a small size, there may be low injection energy condition, and a field stop layer with a larger thickness is easily formed. Due to the second type impurity particles having a large radius, a relatively shallow injection depth may be utilized, and a high annealing temperature is not required. Therefore, damage to a MOSFET structure on a front surface of an N-type substrate due to high temperature annealing can be avoided. In addition, the injection density of the first type impurity particles in the region adjacent to a surface of the N-type drift layer may be the highest, so that the peak voltage that exists when the device is turned off can be effectively reduced and IGBT performance can be greatly improved.

In an optional implementation, the first type impurity particles may be hydrogen ions or helium ions, and the second type impurity particles may be phosphorus atoms or arsenic atoms. It should be understood that the hydrogen ion or the helium ion may be injected deep into the N-type substrate by using relatively few injection energy, thereby greatly increasing the thickness of the field stop layer. In addition, an injection depth of the phosphorus atom or the arsenic atom is relatively shallow, and a high annealing temperature is not required, thereby preventing the IGBT structure from being damaged by high temperature annealing.

In an optional implementation, in the field stop region, the injection density of the first type impurity particles increases sequentially along a direction from the field stop layer to the N-type drift layer. A higher injection density of the impurity particle at the field stop layer indicates a higher change rate of the electric field. Therefore, if the impurity particle is injected in the foregoing gradient way, when the IGBT is turned off, the change rate of the electric field at the field stop layer first reaches the maximum and then gradually decreases, where the change rate of the electric field is the maximum in the region adjacent to the N-type drift layer, so that the electric field may rapidly decrease in a short time. In this way, the peak voltage that exists when the device is turned off can be effectively reduced, and the IGBT performance can be greatly improved.

In an optional implementation, in the field stop region, the injection density of the first type impurity particles decreases sequentially within a first depth from the field stop layer and then increases from the first depth from the field stop layer along the direction from the field stop layer to the N-type drift layer. A higher injection density of the impurity particle at the field stop layer indicates a higher change rate of the electric field. Therefore, if the foregoing gradient injection is used, when the IGBT is turned off, the change rate of the electric field at the field stop layer reaches the maximum in the region adjacent to the N-type drift layer, so that the electric field may rapidly decrease in a short time. In this way, the peak voltage that exists when the device is turned off can be effectively reduced, and the IGBT performance can be greatly improved.

In an optional implementation, in the field stop region, the injection density of the first type impurity particles is random within a first depth from the field stop layer and then increases from the first depth from the field stop layer along the direction from the field stop layer to the N-type drift layer. A higher injection density of the impurity particle at the field stop layer indicates a higher change rate of the electric field. Therefore, if the foregoing gradient injection is used, when the IGBT is turned off, the change rate of the electric field at the field stop layer reaches the maximum in the region adjacent to the N-type drift layer, so that the electric field may rapidly decrease in a short time. In this way, the peak voltage that exists when the device is turned off can be effectively reduced, and the IGBT performance can be greatly improved.

In the foregoing three cases, provided that the injection density of the first type impurity particles in the region adjacent to the N-type drift layer is higher than the injection density of the first type impurity particles in any other region, the electric field strength may be rapidly reduced in a short time, thereby avoiding an excessively high peak voltage.

In an optional implementation, the N-type field stop region is formed by doping two kinds of impurity particles, thereby forming a first doped region and a second doped region sequentially disposed on the surface of the N-type drift layer. The first doped region is formed by doping the first type impurity particles with a smaller radius, the second doped region is formed by doping the second type impurity particles with a larger radius, and a thickness of the first doped region is greater than a thickness of the second doped region.

In the foregoing semiconductor, because the first type impurity particles have a small radius, the first type impurity particles can be injected deep into the N-type substrate by using relatively few injection energy. In addition, a larger thickness of the first doped region indicates a larger thickness of the field stop region. In this way, a tailing current and a loss that exist when the IGBT is turned off can be reduced.

In an optional implementation, the semiconductor further includes:

- a P-type collector layer, disposed on a surface that is of the field stop layer and that faces away from the N-type drift layer; and
- a P-type base layer, disposed on a surface that is of the N-type drift layer and that faces away from the field stop layer; an N-type emitter layer, disposed on a surface that is of the P-type base layer and that faces away from the N-type drift layer; and a gate, connected to the P-type base layer through an oxide layer.

In an optional implementation, in the semiconductor, the gate may penetrate the N-type emitter layer and the P-type base layer or may be disposed on the surface that is of the P-type base layer and that faces away from the N-type drift layer.

A second aspect of embodiments of this application provides a semiconductor preparation method, including:

An N-type substrate is provided, where the N-type substrate includes a first surface and a second surface that are disposed opposite to each other.

A P-type base layer, an N-type emitter layer, an oxide layer, and a gate are formed on the first surface, where the P-type base layer is disposed on the first surface of the N-type substrate, the N-type emitter layer is disposed on a surface that is of the P-type base layer and that faces away from the N-type substrate, and the gate is connected to the P-type base layer through the oxide layer.

A first type impurity particles and a second type impurity particles are injected from the second surface of the N-type substrate, where a particle radius of the first type impurity particles is greater than a particle radius of the second type impurity particles, and an injection depth of the first type impurity particles is greater than an injection depth of the second type impurity particles. In a process of injecting the first type impurity particles, an injection density of the first type impurity particles in a region adjacent to the first surface of the N-type substrate are higher than an injection density of the first type impurity particles in any other region.

A P-type collector layer is formed on the second surface of the N-type substrate.

In an optional implementation, the first type impurity particles may be a hydrogen ion or a helium ion, and the second type impurity particles may be a phosphorus atom or an arsenic atom. It should be understood that the hydrogen ion or the helium ion may be injected deep into the N-type substrate by using relatively few injection energy, thereby greatly increasing the thickness of the field stop layer. In addition, an injection depth of the phosphorus atom or the arsenic atom is relatively shallow, and a high annealing temperature is not required, thereby preventing the IGBT structure from being damaged by high temperature annealing.

In an optional implementation, the first type impurity particles may be injected from the second surface by using first injection energy, and the second type impurity particles may be injected from the second surface by using second injection energy, so that the first injection energy and the second injection energy enable the injection depth of the first type impurity particles to be greater than the injection depth of the second type impurity particles.

The radius of the first type impurity particles are smaller than the radius of the second type impurity particles. Therefore, if the first injection energy and the second injection energy are the same, the injection depth of the first type impurity particles is greater than the injection depth of the second type impurity particles; in other words, the first type impurity particles can be injected into a larger depth by using less injection energy. Therefore, the injection energy can be reduced by using the foregoing gradient-density injection manner.

In an optional implementation, in the field stop region, the injection density of the first type impurity particles increases sequentially along a direction from the field stop layer to the N-type drift layer. A higher injection density of the impurity particle at the field stop layer indicates a higher change rate of the electric field. Therefore, if the impurity particle is injected in the foregoing gradient way, when the IGBT is turned off, the change rate of the electric field at the field stop layer first reaches the maximum and then gradually decreases, where the change rate of the electric field is the maximum in the region adjacent to the N-type drift layer, so that the electric field may rapidly decrease in a short time. In this way, the peak voltage that exists when the device is turned off can be effectively reduced, and the IGBT performance can be greatly improved.

In an optional implementation, in the field stop region, the injection density of the first type impurity particles decreases sequentially within a first depth from the field stop layer and then increases from the first depth from the field stop layer along the direction from the field stop layer to the N-type drift layer. A higher injection density of the impurity particle at the field stop layer indicates a higher change rate of the electric field. Therefore, if the foregoing gradient injection is used, when the IGBT is turned off, the change rate of the electric field at the field stop layer reaches the maximum in the region adjacent to the N-type drift layer, so that the electric field may rapidly decrease in a short time. In this way, the peak voltage that exists when the device is turned off can be effectively reduced, and the IGBT performance can be greatly improved.

In an optional implementation, in the field stop region, the injection density of the first type impurity particles is random within a first depth from the field stop layer and then increases from the first depth from the field stop layer along the direction from the field stop layer to the N-type drift layer. A higher injection density of the impurity particle at the field stop layer indicates a higher change rate of the electric field. Therefore, if the foregoing gradient injection is used, when the IGBT is turned off, the change rate of the electric field at the field stop layer reaches the maximum in the region adjacent to the N-type drift layer, so that the electric field may rapidly decrease in a short time. In this way, the peak voltage that exists when the device is turned off can be effectively reduced, and the IGBT performance can be greatly improved.

In an optional implementation, after the first type impurity particles and the second type impurity particles are injected from the second surface, annealing further needs to be performed on the N-type substrate into which the first type impurity particles and the second type impurity particles are injected.

A third aspect of embodiments of this application provides a power module, where the power module may include at least one semiconductor device according to the first aspect or any implementation of the first aspect, or at least one semiconductor device prepared by using the method according to the second aspect or any implementation of the second aspect.

For example, the power module further includes a diode device and a substrate. The semiconductor device and the diode device are connected in parallel, the semiconductor device and the diode device are insulated from each other, and the substrate is used to package the semiconductor device and the diode device.

The semiconductor device is an IGBT, and the power module may be an IGBT discrete device, an IGBT module, an intelligent power module (intelligent power module, IPM), or the like.

A fourth aspect of embodiments of this application provides a power conversion circuit, including at least one semiconductor device according to the first aspect or any implementation of the first aspect, or at least one semiconductor device prepared by using the method according to the second aspect or any implementation of the second aspect.

The power conversion circuit is a circuit configured to implement functions such as frequency conversion, voltage transformation, phase change, rectification, inversion, and switching on a voltage/current. The power conversion circuit may be an inverter circuit (inverter circuit), a rectifier circuit (rectifier), a converter circuit, or the like.

DESCRIPTION OF EMBODIMENTS

Figure 1:
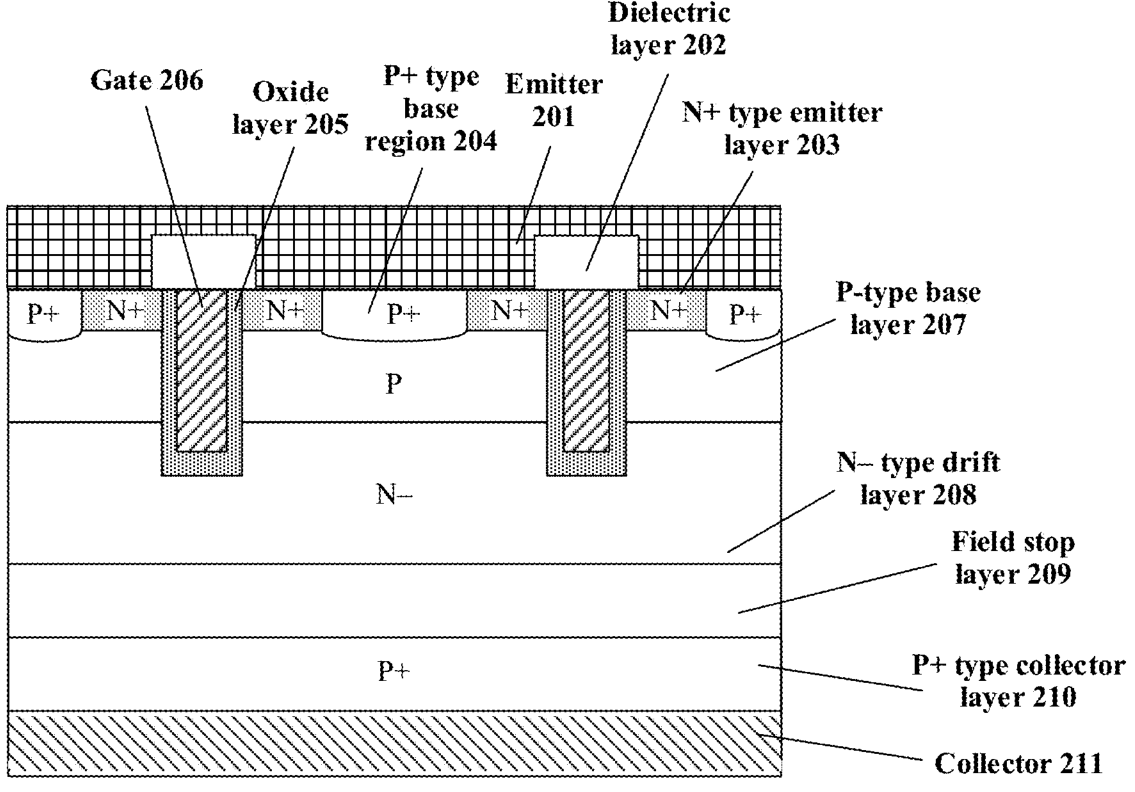
FIG. 1 is a schematic sectional view of an IGBT according to an embodiment of this application.

Embodiments of this application provide a semiconductor device, a related chip, and a preparation method, so as to alleviate a situation in which a semiconductor device in which a field stop layer is formed through proton (H+) injection generates an excessively high peak voltage in a circuit with a large parasitic inductance.

As a switching device, an IGBT is a composite full-control voltage-driven power semiconductor device that includes a BJT and a MOSFET. The IGBT can be used in fields such as energy conversion and transmission circuits, for example, frequency conversion, voltage transformation, phase change, rectification, inversion, and switching on a voltage/current. The BJT has a low saturation voltage drop and a high current carrying capacity, but may have a relatively large drive current. The MOSFET has a low drive power and a high switching speed, but may have a high on-state voltage drop and a low current carrying capacity. The IGBT integrates advantages of the MOSFET and the BJT and may have advantages such as high input impedance, a high switching speed, good thermal stability, a simple drive circuit, a small drive current, a low saturation voltage drop, high voltage resistance, and/or a high current carrying capacity.

Therefore, the IGBT may be applied to a power conversion circuit, for example, an inverter circuit (inverter circuit), a rectifier circuit (rectifier), and a converter circuit, that implements functions such as frequency conversion, voltage transformation, phase change, rectification, inversion, and switching on a voltage/current. The following separately describes each circuit and an application scenario thereof.

1. The inverter circuit is a circuit that converts direct current electric energy into constant frequency and constant voltage alternating current power or frequency-modulated and voltage-regulated alternating current power, and usually includes an inverter bridge, logic control, a filter circuit, and the like. The foregoing IGBT device is used as a switching device of the inverter bridge. The inverter circuit in which the semiconductor device provided in this application is used as a switching device may be applied to a scenario in which a power supply is a direct current power supply and power needs to be supplied to an alternating current load. For example, when a battery in an electric vehicle supplies power to an alternating current motor, electric energy needs to be converted by using the inverter circuit. In another example, before a solar cell is provided to an alternating current power grid, electric energy may be converted by using the inverter circuit.

2. The rectifier circuit is a circuit that converts alternating current electric energy into direct current electric energy, and usually includes a main circuit, a filter, and a converter. The main circuit may be formed by using a rectifier diode and the IGBT device provided in this application. The filter is connected between the main circuit and the load and is configured to filter out an alternating current component in a pulsating direct current voltage. Whether a transformer is disposed depends on an actual situation. The transformer is configured to match an alternating current input voltage and a direct current output voltage and implement galvanic isolation between an alternating current grid and the rectifier circuit. The rectifier circuit in which the IGBT device provided in this application is used as a switching device may be applied to a scenario in which alternating current power needs to be converted into direct current power. For example, when an electric vehicle charges a battery, alternating current power may be converted, by using a charging pile or a charger that includes the rectifier circuit, into direct current power that has a rated voltage and that is utilized by the electric vehicle.

3. The converter circuit may be a boost converter or a buck conversion circuit (Buck Converter).

The boost converter is a direct current-direct current converter that can step up a voltage, and an output (a load) voltage of the boost converter greater than an input (a power supply) voltage. The boost converter mainly includes at least one diode, at least one transistor, and at least one energy storage element (an inductor). The IGBT device provided in this disclosure may be used as a transistor.

The buck conversion circuit is also referred to as a buck converter and is a direct current-direct current converter that can step down a voltage. An output (a load) voltage of the buck converter is less than an input (a power supply) voltage, but an output current of the buck converter is greater than an input current. The buck converter mainly includes at least one diode, at least one transistor, and at least one energy storage element (a capacitor and/or an inductor). Optionally, a capacitor-based filter may be further added to an output end and an input end to reduce voltage ripples. The IGBT device provided in this disclosure may be used as a transistor.

The semiconductor device provided in this disclosure may be used as a switching device and may be alternatively applied to another circuit, such as a direct current boost circuit and a direct current buck circuit, that utilize a power semiconductor device. This is not specifically limited.

A structure of an IGBT is described in detail below. FIG. 1 is a schematic sectional view of an IGBT according to an embodiment of this application. As shown in FIG. 1, the IGBT is a trench-type IGBT, and sequentially includes, from top to bottom, some or all of layer structures, such as an emitter 201, a dielectric layer 202, N+ type emitter layers 203, a P+ type base region 204, an oxide layer 205, a gate 206, a P-type base layer 207, an N− type drift layer 208, a field stop layer 209, a P+ type collector layer 210, and a collector 211.

Before the layer structures of the IGBT are described, an N-type semiconductor and a P-type semiconductor are first described.

(1) N (Negative)-type semiconductor, also referred to as an electron-type semiconductor, is a semiconductor with electron conduction. An N-type semiconductor may be obtained by doping a donor impurity into an intrinsic semiconductor. For example, an extra free electron exists after a small amount of 5-valence element (phosphorus, arsenic, or the like) is doped into pure silicon and the phosphorus is covalently combined with a surrounding 4-valence silicon atom. N type can be divided into N+ type (multi-electron type) and N− type (less electron type). A doping density of an impurity particle in an N+ type semiconductor is greater than a doping density of an impurity particle in an N− type semiconductor. It may be understood that N+ type (multi-electron type) and N− type (less electron type) are relative.

In this embodiment of this application, the N+ type emitter layers 203, the N− type drift layer 208, the field stop layer 209, the N-type substrate, and the like are all N-type semiconductors.

(2) P (Positive)-type semiconductor, also referred to as a hole-type semiconductor, is a semiconductor with hole conduction. Specifically, a P-type semiconductor may be obtained by doping an acceptor impurity into an intrinsic semiconductor. For example, an electron is absent to form a hole after a small amount of 3-valence element (boron, indium, or the like) is doped into pure silicon and the boron is covalently combined with a surrounding 4-valence silicon atom. P type can be divided into P+ type (multi-hole type) and P− type (less hole type). A doping density of an impurity particle in a P+ type semiconductor is greater than a doping density of an impurity particle in a P− type semiconductor.

In this embodiment of this application, the P+ type base region 204, the P-type base layer 207, the P+ type collector layer 210, and the like are all P-type semiconductors.

The N− type drift layer 208 and the field stop layer 209 both belong to the N-type substrate. The field stop layer 209 is formed by injecting an impurity particle on a back surface (a surface adjacent to a collector 111) of the N-type substrate and has a higher doping density than the N− type drift layer 208. Therefore, the field stop layer 209 is also referred to as an N+ field stop layer.

The N− type drift layer 208, which is a part of the N-type substrate, has a first surface and a second surface that are disposed opposite to each other. The P-type base layer 207 is disposed on the first surface of the N− type drift layer 208. The first surface of the N− type drift layer 208 may be a first surface or a front surface of the N-type substrate, and the P-type base layer 207 may be an epitaxial layer of the N-type substrate. Alternatively, the front surface of the N-type substrate may be a surface that is of the P-type base layer 207 and that faces away from the N− type drift layer 208. In this case, the P-type base layer 207 is formed by injecting impurities from the front surface of the N-type substrate. Herein, the surface that is of the N-type substrate and that is adjacent to the collector 211 is referred to as the second surface or the back surface of the N-type substrate. The first surface and the second surface of the N-type substrate are two surfaces that are disposed opposite to each other on the N-type substrate.

The N+ type emitter layers 203 are disposed on a surface that is of the P-type base layer 207 and that faces away from the N− type drift layer 208, and may be formed by injecting impurities. The N+ type emitter layers 203 are spaced apart at the P-type base layer 207. Optionally, at the P-type base layer 207, a P+ type base region 204 may be further included between two N+ type emitter layers 203 of the IGBT. In this case, the P-type base layer 207 may also be referred to as a P− type base layer.

The oxide layer 205 covers the P-type base layer 207, and the gate 206 is connected to the P-type base layer 207 through the oxide layer 205. In this way, when a voltage gate to source (VGS) applied between the gate 206 and the emitter 201 is greater than a critical value voltage gate and emitter to source (VGES), a position that is at the P-type base layer 207 and that is adjacent to the oxide layer 205 may form a channel through which the N+ type emitter layers 203 and the N− type drift layer 208 are conducted.

The P+ type collector layer 210 is disposed on a surface that is of the field stop layer 209 and that faces away from the N− type drift layer 208. The collector 211 is disposed on a surface that is of the P+ type collector layer 210 and that faces away from the field stop layer 209.

In the foregoing IGBT, the N+ type emitter layers 203 on the front surface form a source region, an electrode attached thereto is the emitter 201, and an electrode led out from the P+ type collector layer 210 that is on the back surface is the collector 211. A control region of the IGBT device is the gate 206, and the channel is formed close to a gate region boundary. The N+ type emitter layers 203 are on one side of the channel, and the N− type drift layer 208 is on the other side of the channel. When the IGBT works normally, a conductive channel is formed on the surface of the P-type base layer 207. Electrons flow from the emitter layer to the collector layer through the N− type drift layer, while holes are continuously injected from the collector layer to the N− type drift layer. In this case, there is a load current on the IGBT from a perspective of outside expression, and the IGBT is in the on state. Due to a relatively large width of the N− type drift layer 208, some of the holes have conductivity modulation with electrons herein, thereby reducing an on-state voltage drop of the device, and the remaining holes diffuse to a PN junction formed by the P-type base layer 207 and the N− type drift layer 208, and are finally collected by the emitter layers 203.

In the foregoing IGBT, the doping density of the field stop layer 209 is slightly higher than the doping density of the N-type substrate. Therefore, introduction of the field stop layer 209 can rapidly reduce electric field strength and enable the entire electric field to be gradient, thereby stopping the electric field and greatly reducing a required thickness of the N− type drift layer 208. In addition, the field stop layer 209 can further adjust transmit efficiency of the P+ type base region 204, to change a tailing current and a loss that exist during turn-off. Within a predetermined range, if the field stop layer is thicker, voltage stress existing in a process of turning off the IGBT can be alleviated, to improve voltage resistance of the device.

Conventional process methods for forming the field stop layer 209 mainly include the following several methods: One method is that the field stop layer is formed by directly using an epitaxial substrate. However, this method requires an epitaxial process, and the substrate is relatively costly. Another method is that the field stop layer is formed by injecting a phosphorus ion from the back surface of the N-type substrate and then performing annealing. In this solution, because the phosphorus ion is injected from the back surface of the N-type substrate, an injection depth of the phosphorus ion is affected by injection energy, and it may be difficult to inject the phosphorus ion quite deeply. In addition, when the injection energy increases, fragments easily occur, and the process may be rather difficult. Another method is that the field stop layer is formed through proton (H+) injection. Through the proton (H+) injection, a hole/hydrogen-related complex is formed and is presented as a donor in the field stop region, where a quantity of donors per unit of volume determines a doping density. A disadvantage of this technology lies in that when an IGBT product is under a high temperature, a corresponding leakage current of the IGBT product is very large. In a case of a large leakage current under a high temperature, a leakage loss of the device in a standby mode is directly affected, and even the device is burnt out. In addition, when thermal resistance of the device is consistent with an ambient temperature of the device, corresponding power consumption and a corresponding junction temperature of the device are higher. Furthermore, the IGBT product made by using the foregoing processes generates a quite large peak single voltage in a turn-off process. This may cause the IGBT product itself or other components in a circuit to be broken down and damaged due to overvoltage.

Although fast turn-on and turn-off of the IGBT help shorten switching time and reduce a switching loss, excessively fast turn-on and turn-off of the IGBT may be harmful in a circuit with a large parasitic inductance. This is because if there is no parasitic inductor, when the IGBT is turned off from turn-on, there is a current loop formed by freewheeling of a freewheeling diode, and a voltage on the IGBT rises slowly until the voltage reaches a value that is a diode voltage drop value higher than a bus voltage. If there is a parasitic inductor, the load circuit is prevented from switching to the freewheeling diode, voltages that prevent an increase of a bus current are generated at both ends of the inductor, and the voltages are superimposed with a power voltage in a form of a peak voltage at both ends of the IGBT. This leads to a sharp rise in the peak voltage and an overshooting phenomenon. In this case, the IGBT withstands a higher impact, and it is likely to cause the IGBT itself or other components in the circuit to be broken down and damaged due to overvoltage. Therefore, the IGBT performance can be greatly improved by improving the production process of the IGBT and alleviating the peak voltage that exists when the device is turned off.

Figure 2:
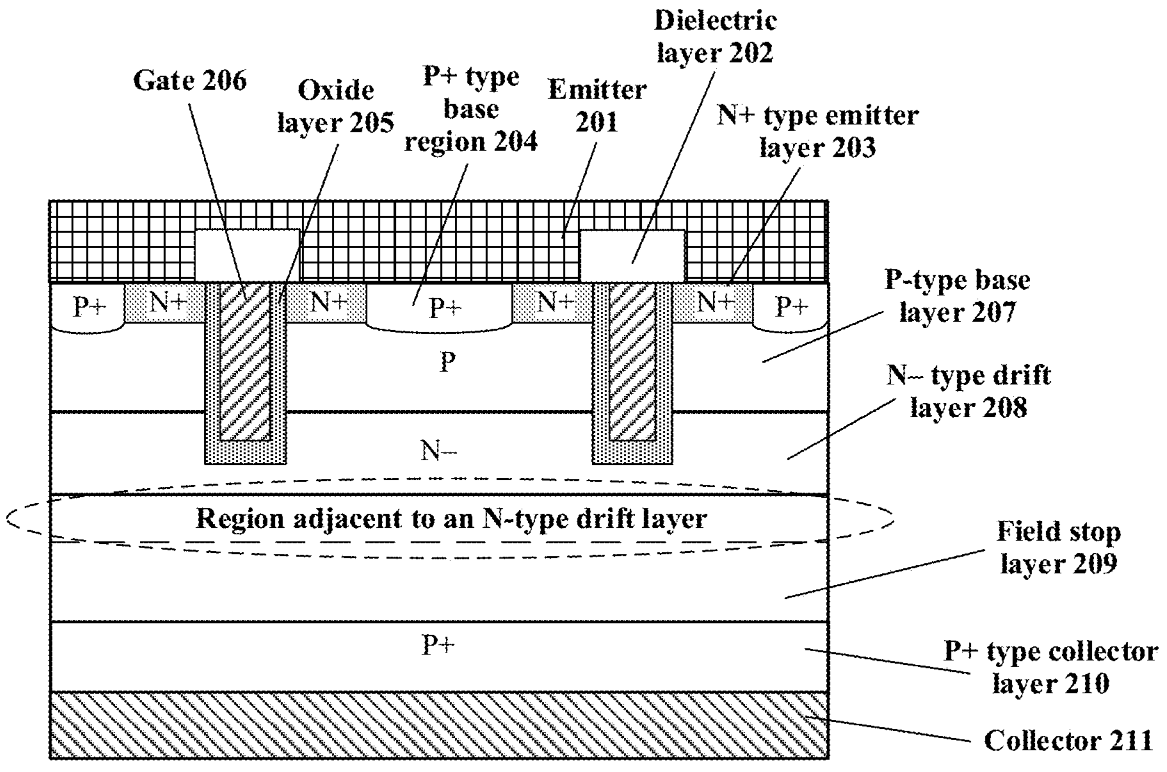
FIG. 2 is a schematic sectional view of another IGBT according to an embodiment of this application.

Based on the foregoing descriptions, an embodiment of this application provides a new field stop region structure, as shown in FIG. 2. FIG. 2 is a schematic sectional view of another IGBT according to an embodiment of this application. The IGBT is still a trench-type IGBT, and sequentially includes, from top to bottom, some or all of layer structures, such as an emitter 201, a dielectric layer 202, N+ type emitter layers 203, a P+ type base layer 204, an oxide layer 205, a gate 206, a P-type base layer 207, an N− type drift layer 208, a field stop layer 209, a P+ type collector layer 210, and a collector 211. It may be understood that the foregoing layers have similar structures and functions as the layers in the embodiment shown in FIG. 1. Details are not described herein again.

The field stop layer 209 is formed by doping two kinds of impurity particles, including first type impurity particles and second type impurity particles. The first type impurity particles have a different radius from the second type impurity particles. The first type impurity particles with a smaller radius can be injected into a deeper region at the field stop layer 209 by using less injection energy, and the second type impurity particles with a larger radius has a relatively shallow injection depth and provides a lower annealing temperature, to prevent an IGBT structure from being damaged during high temperature annealing. It may be understood that a density of free electrons at the field stop layer 209 is higher than a density of free electrons at the N− type drift layer 208, and both the first type impurity particles and the second type impurity particles enter the field stop region 209 in a manner of being injected from a back surface of the N-type substrate.

The first type impurity particles have a relatively small particle radius, the second type impurity particles has a relatively large particle radius, and the first type impurity particles have a small size. Therefore, less injection energy is required for a same injection depth, and a field stop layer with a large thickness can be implemented. The field stop region having the first type impurity particles and the second type impurity particles increases a thickness of an N-type electron layer, while electric leakage between a collector and an emitter of the IGBT may be reduced.

For example, the first type impurity particles is a hydrogen ion (H+) or a helium ion (He+), and an impurity in a second doped region is a 5-valence or higher-valence atom, such as a phosphorus atom and an arsenic atom. In an embodiment of this application, the hydrogen ion (H+) or the helium ion (He+) needs to be injected deep into an N-type substrate 1 because energy required for an injection depth thereof is far less than energy required for an injection depth of the phosphorus atom and the arsenic atom. The thickness of the field stop layer can be greatly increased by injecting a large quantity of hydrogen ions (H+) or helium ions (He+). It may be understood that if the field stop layer is thicker, a tailing current and a loss that exist when the IGBT is turned off are smaller and IGBT performance is higher.

When the first type impurity particles are injected, an injection density of the first type impurity particles in a region adjacent to a surface of the N− type drift layer 208 may be higher than an injection density of the first type impurity particles in any other region. In this way, an electric field change rate reaches a maximum in the region adjacent to the surface of the N− type drift layer 208, and electric field strength may rapidly decrease in a short time, so that a peak voltage that exists when the device is turned off can be effectively reduced and the IGBT performance can be greatly improved. An injection depth refers to a distance between the impurity particle and the back surface of the N-type substrate.

The following describes a region adjacent to an N-type drift layer. As shown in FIG. 2, the region adjacent to the N-type drift layer is marked in FIG. 2, that is, a part of a region close to the surface of the N− type drift layer 208. It may be understood that an injection manner of the first type impurity particles is that the first type impurity particles are injected into different depths in steps by using different injection energy, and the first type impurity particles are injected from the back surface of the N-type substrate. Therefore, the region adjacent to the N-type drift layer corresponds to a largest injection depth. After being injected into the N-type substrate, the first type impurity particles performs a diffusion movement, but always diffuses around the injection depth. Therefore, the region adjacent to the N-type drift layer is determined based on the largest injection depth. A predetermined region size may be determined based on the actual situation, but may not specifically determined.

It should be noted that, in embodiments, the injection density of the first type impurity particles in the region adjacent to the N-type drift layer is not higher than the injection density of the first type impurity particles in any other region. The diffusion movement of the particle may define an irregular movement. In the region adjacent to the N-type drift layer, densities of the first type impurity particles at different positions are not completely the same. Therefore, the injection density of the first type impurity particles may still correspond to the largest injection depth. In other words, when the first type impurity particles are injected, a position with the largest injection density is injected with the maximum dosage of the first type impurity particles. After the particle performs the diffusion movement, under a condition of a same region size, an average density of the first type impurity particles in the region adjacent to the N-type drift layer is higher than an average density of the first type impurity particles in another region. In this way, a peak voltage that exists when the device is turned off can be effectively reduced.

In an optional implementation, in the field stop region, the injection density of the first type impurity particles increases sequentially along a direction from the field stop layer to the N-type drift layer. A higher injection density of the impurity particle at the field stop layer indicates a higher change rate of the electric field. Therefore, if the impurity particle is injected in the foregoing gradient way, when the IGBT is turned off, the change rate of the electric field at the field stop layer first reaches the maximum and then gradually decreases, where the change rate of the electric field is the maximum in the region adjacent to the N-type drift layer, and the electric field decreases rapidly in a short time. In this way, the peak voltage that exists when the device is turned off can be effectively reduced, and the IGBT performance can be greatly improved.

For example, in the field stop layer 209, the injection density of the first type impurity particles increases sequentially with an increase of the injection depth. In other words, the injection density of the first type impurity particles increases sequentially along the direction from the field stop layer 209 to the N− type drift layer 208, and the injection density reaches the maximum in the region adjacent to the N− type drift layer 208.

In another example, in the field stop layer 209, the injection density of the first type impurity particles decreases sequentially within a first depth from the field stop layer and then increases from the first depth from the field stop layer with an increase of the injection depth, to ensure that the injection density reaches the maximum in the region adjacent to the N− type drift layer 208. In other words, the injection density of the first type impurity particles decreases and then increases along the direction from the field stop layer 209 to the N− type drift layer 208, and the injection density of the first type impurity particles reaches the maximum in the region adjacent to the field stop layer 209.

In another example, in the field stop layer 209, the injection density of the first type impurity particles is random within a first depth from the field stop layer and then increases from the first depth from the field stop layer with an increase of the injection depth, to ensure that the injection density reaches the maximum in the region adjacent to the N− type drift layer 208. In other words, along the direction from the field stop layer 209 to the N− type drift layer 208, the injection density of the first type impurity particles is not limited, and the injection density may be randomly distributed, provided that the injection density of the first type impurity particles reaches the maximum in the region adjacent to the N− type drift layer 208.

In the foregoing three cases, when the IGBT is turned off, the electric field change rate of the electric field at the field stop layer 209 may reach the maximum in the region adjacent to the N-type drift layer, so that the electric field may rapidly decrease in a short time. In this way, the peak voltage that exists when the device is turned off can be effectively reduced, and the IGBT performance can be greatly improved.

The following briefly describes doping of the second type impurity particles.

Figure 3:
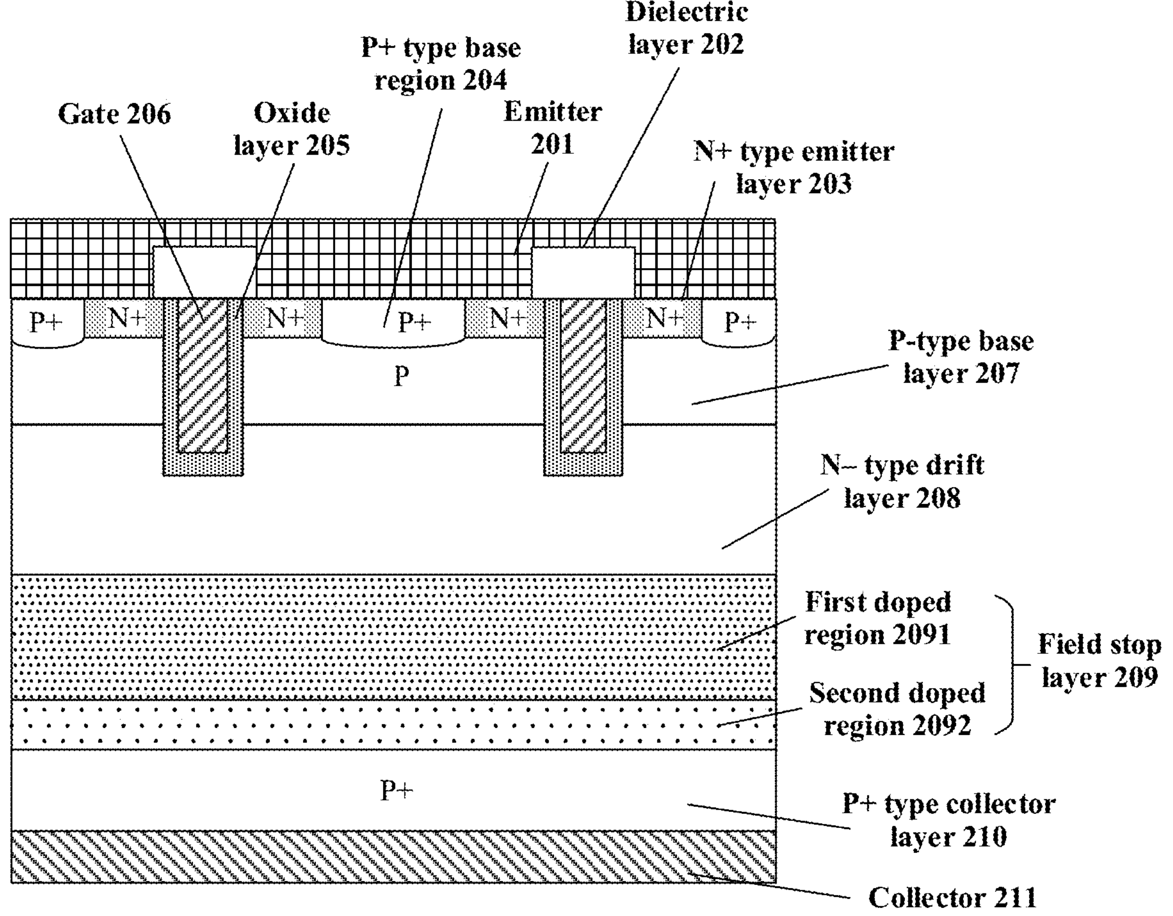
FIG. 3 is a schematic sectional view of another IGBT according to an embodiment of this application.

FIG. 3 is a schematic sectional view of another IGBT according to an embodiment of this application. The IGBT is still a trench-type IGBT, and sequentially includes, from top to bottom, some or all of layer structures, such as an emitter 201, a dielectric layer 202, N+ type emitter layers 203, a P+ type base region 204, an oxide layer 205, a gate 206, a P-type base layer 207, an N− type drift layer 208, a field stop layer 209, a P+ type collector layer 210, and a collector 211. It may be understood that the foregoing layers have similar structures and functions as the layers in the embodiment shown in FIG. 2. Details are not described herein again. The field stop layer 209 is formed by doping two kinds of impurity particles, and injection depths of the two kinds of impurity particles are different. Therefore, the field stop layer 209 includes a first doped region 2091 and a second doped region 2092 that are sequentially laminated on a second surface of the N− type drift layer 208.

A radius of an impurity particle (a first impurity particle) in the first doped region 2091 is smaller than a radius of an impurity particle (a second impurity particle) in the second doped region 2092, and both a doping density in the first doped region 2091 and a doping density in the second doped region 2092 are higher than a doping density at the N− type drift layer 208. The first doped region 2091 is formed in a manner of injecting the first type impurity particles from a back surface of the N-type substrate, and an impurity in the second doped region 2092 is formed in a manner of injecting the second type impurity particles from the back surface of the N-type substrate.

The first type impurity particles may define a relatively small radius and may define a relatively large injection depth that may be achieved by using relatively small injection energy. Therefore, a thickness of the first doped region 2091 is greater than a thickness of the second doped region 2092. For example, the first doped region 2091 has a thickness of 5-50 micrometers, and the second doped region 2092 has a thickness of 2-10 micrometers. A larger thickness of the first doped region 2091 indicates a larger thickness of the field stop layer. This may reduce a tailing current and a loss that exist when the IGBT is turned off.

As shown in FIG. 3, a thickness refers to a length of the field stop layer 209, that is, a distance between two surfaces of the field stop layer 209, in a direction from the field stop layer 209 to the N− type drift layer 208. In an actual IGBT transistor, both the first doped region 2091 and the second doped region 2092 may have uneven thicknesses due to irregular diffusion of particles. Therefore, it is not absolute that the thickness of the first doped region 2091 is greater than the thickness of the second doped region 2092 throughout, and may be understood that a thickness in a part of the first doped region 2091 is smaller than a thickness in a part of the second doped region 2092, provided that an average thickness of the first doped region 2091 is greater than an average thickness of the second doped region 2092.

For the injection density of the first type impurity particles in the first doped region 2091, refer to the injection density of the first type impurity particles in the embodiment shown in FIG. 2, provided that the injection density of the first type impurity particles is the maximum in the region close to the surface of the N− type drift layer 208. In the second doped region 2092, the injection density of the second type impurity particles decreases or substantially decreases along a direction away from the P+ type collector layer 210. In other words, in the direction from the field stop layer 209 to the N− type drift layer 208, the injection density of the second type impurity particles decreases or substantially decreases with an increase of the injection depth.

It should be understood that if a doping density of the impurity particle is larger, there are more free electrons at the field stop layer 209, and there is much more recombination of the electrons with holes at the collector 211 in a unit time when the IGBT is turned off. In this case, the current changes faster, resulting in greater voltage stress. Large voltage stress may cause poor voltage resistance of the device. When gradient doping is used, doping densities successively decrease in a direction from the P+ type collector layer 110 to the field stop layer 209, so that the current can first change quickly and then change slowly. This reduces, without affecting a turn-off speed, the voltage stress existing when the IGBT is turned off, to improve the voltage resistance of the device.

In the foregoing IGBT, a problem of a large leakage current of the semiconductor device can be effectively improved by injecting a plurality of kinds of impurity particles to form a field stop layer. In addition, it is specified that the injection density of the first type impurity particles at the field stop layer should reach the maximum at an intersection between the field stop layer and the N− type drift layer. In this way, a situation in which the semiconductor device generates an excessively high peak voltage in a circuit with a large parasitic inductance can be alleviated and working performance of the semiconductor device can be greatly improved.

Figure 4:
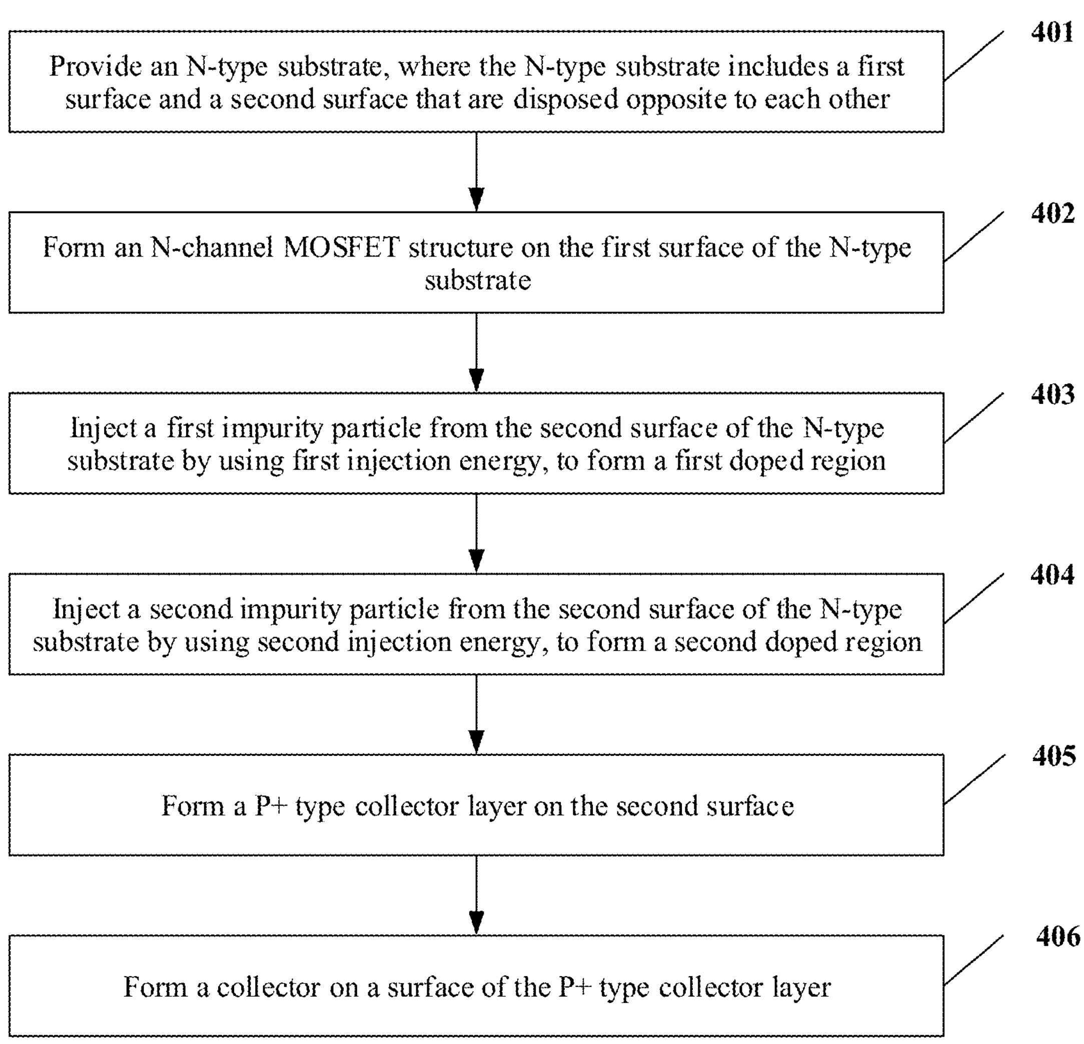
FIG. 4 is a schematic flowchart of an IGBT preparation method according to an embodiment of this application.

The following describes in detail a method for preparing an IGBT. FIG. 4 is a schematic flowchart of an IGBT preparation method according to an embodiment of this application. The method is used to prepare the IGBT shown in FIG. 2. The method may include but is not limited to the following steps.

At step 401, provide an N-type substrate, where the N-type substrate includes a first surface and a second surface that are disposed opposite to each other.

Figure 5A:
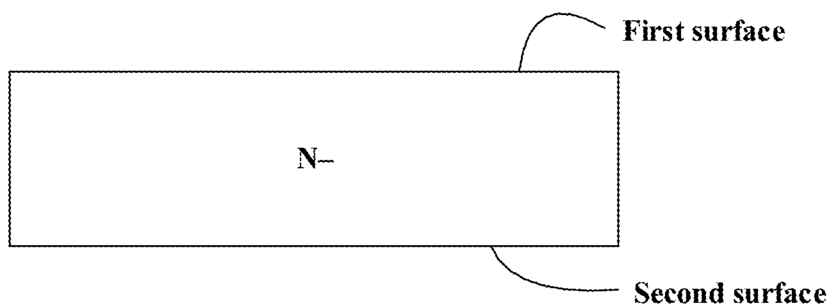
FIG. 5A is a schematic diagram of a structure of an IGBT according to an embodiment of this application.

The N-type substrate is a semiconductor with electron conduction. Specifically, an N-type semiconductor may be obtained by doping a donor impurity into an intrinsic semiconductor. For example, an extra free electron exists after a small amount of 5-valence element (phosphorus, arsenic, or the like) is doped into pure silicon and the phosphorus is covalently combined with a surrounding 4-valence silicon atom. For an example embodiment, refer to FIG. 5A.

At step 402, form an N-channel MOSFET structure on the first surface of the N-type substrate.

Figure 5B:
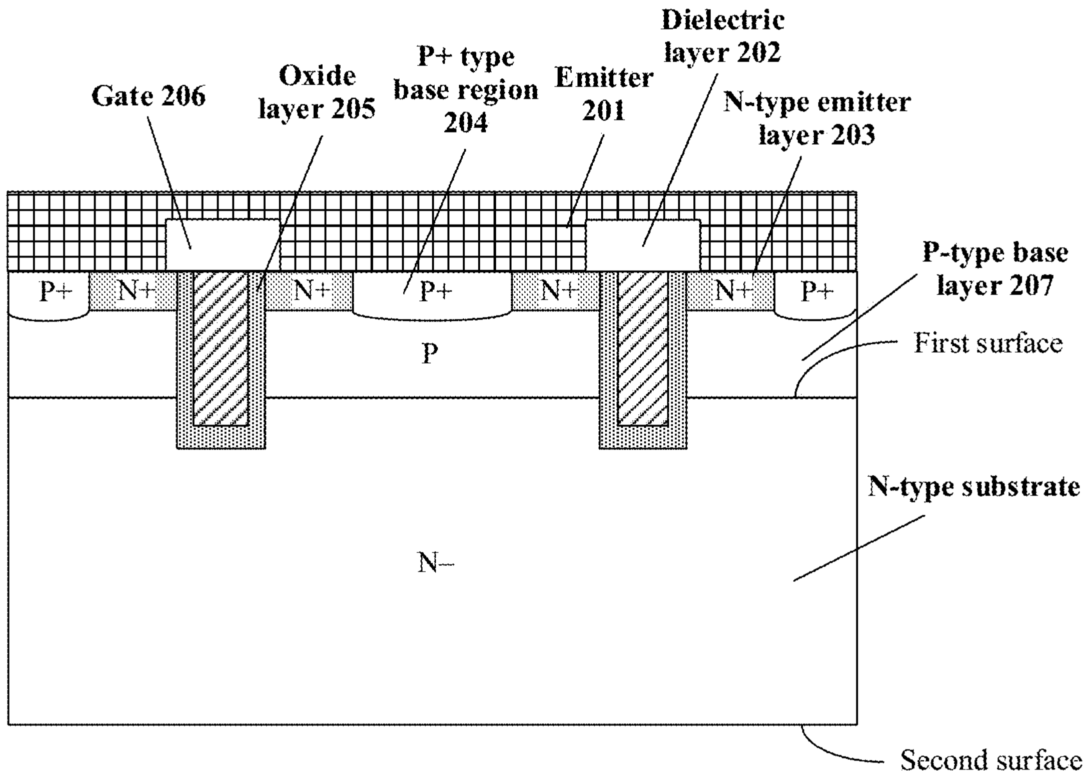
FIG. 5B is a schematic diagram of a structure of another IGBT according to an embodiment of this application.

As shown in FIG. 5B, when the N-channel MOSFET structure is formed on the first surface of the N-type substrate, a P-type base layer 207 may be established on the first surface, an N region, such as N+ type emitter layers 203, is formed at the P-type base layer 207, an oxide layer 205 is determined by using a thermal oxidation process, and finally, a gate 206, an emitter 201, and the like are separately led out. In FIG. 5B, a dielectric layer 202 and the emitter layers 203 are not mandatory layer structures of the N-channel MOSFET structure. In some embodiments, the semiconductor device may not include the dielectric layer 202 or the emitter layers 203.

Figure 6:
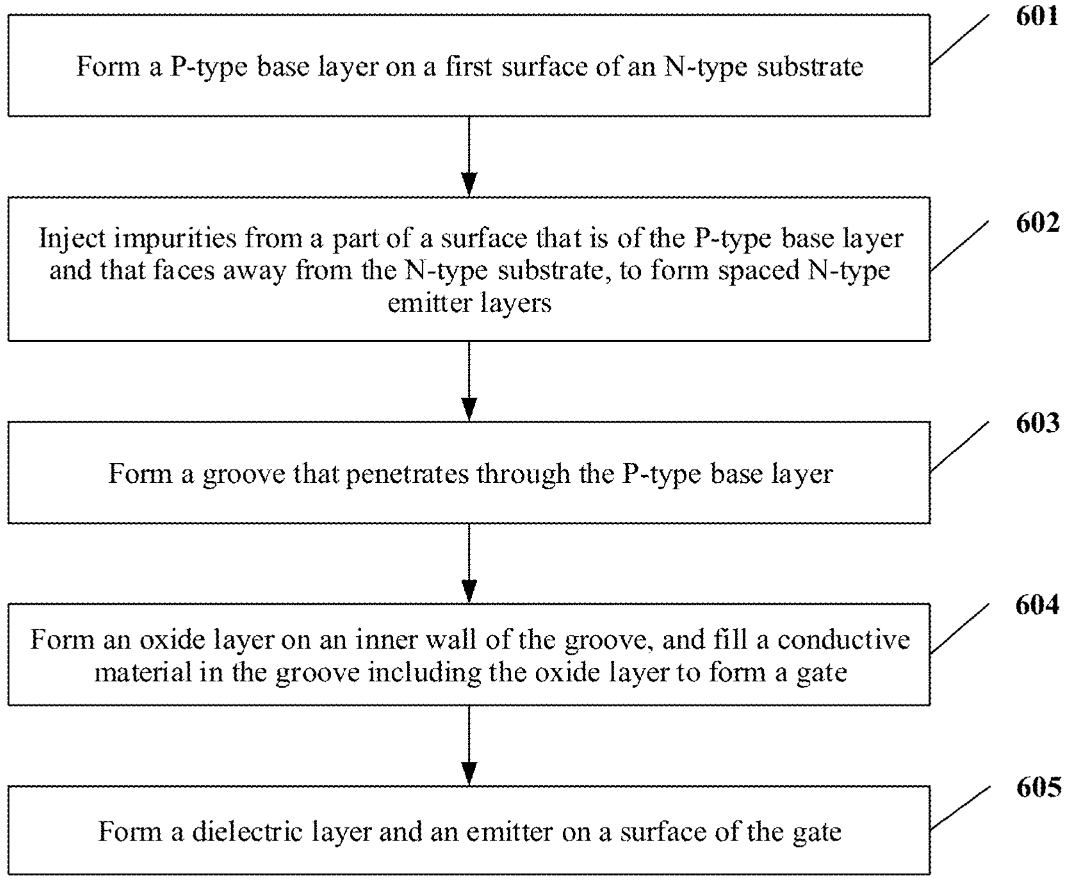
FIG. 6 is a schematic flowchart of forming an N-channel MOSFET structure on a first surface of an N-type substrate according to an embodiment of this application.

In this embodiment of this application, the prepared semiconductor device is a trench-type IGBT. FIG. 6 is a schematic flowchart of forming an N-channel MOSFET structure on a first surface of an N-type substrate according to an embodiment of this application. The flowchart includes the following steps.

At step 601, form a P-type base layer 207 on the first surface of the N-type substrate.

There may be a plurality of preparation manners of the P-type base layer 207. For example, the P-type base layer 207 may be formed in an epitaxial growth manner on the first surface of the N-type substrate, or a P-well is formed by injecting impurities on the first surface of the N-type substrate, where the P-well is the P-type base layer 207. A predetermined form is not limited.

At step 602, inject impurities from a part of a surface that is of the P-type base layer 207 and that faces away from the N-type substrate, to form the spaced N+ type emitter layers 203. The N+ type emitter layers 203 constitute a source region of the IGBT.

At step 603, form a groove that penetrates through the P-type base layer 207.

At step 604, form an oxide layer 205 on an inner wall of the groove and fill a conductive material in the groove including the oxide layer 205 to form a gate 206. In this case, the gate 206 is connected to the P-type base layer 207 through the oxide layer 205. In this way, when a voltage VGS applied between the gate 206 and the N+ type emitter layers 203 is greater than a critical value VGES, a position that is at the P-type base layer 207 and that is adjacent to the oxide layer 205 may form a channel through which the N+ type emitter layers 203 and the N-type drift layer are conducted.

At step 605, form a dielectric layer 202 and an emitter 201 on a surface of the gate 206, where the dielectric layer 202 is used to isolate the gate 206 and the emitter 201, and the emitter 201 is connected to the N+ type emitter layers 203.

Optionally, a P+ type base layer 204 may be further formed on the surface that is of the P-type base layer 207 and that faces away from the N-type substrate, and the P+ type base layer 204 may be located between two adjacent N+ type emitter layers 203.

It should be noted that the foregoing layer structures may be prepared by using a photolithography technology and a thin film preparation technology. This is not limited herein.

It should be further noted that the semiconductor device is not limited to the foregoing content shown in FIG. 5B, but may further include another structure and another preparation method. This is not limited in this embodiment of this application.

Referring back to FIG. 4, at step 403 includes injecting a first type impurity particles from the second surface of the N-type substrate by using first injection energy.

At step 404, inject second type impurity particles from the second surface of the N-type substrate by using second injection energy.

A purpose of step 403 and step 404 is to establish the field stop layer of the IGBT. To be specific, the field stop layer 209 having a plurality of doped regions is formed by injecting a plurality of varying kinds of impurity particles, to effectively alleviate a problem of a large leakage current of the semiconductor device. In addition, a doping density of the first type impurity particles needs to be specified, to alleviate the situation in which the semiconductor device generates an excessively high peak voltage in a circuit with a large parasitic inductance, and to improve IGBT performance.

Figure 5C:
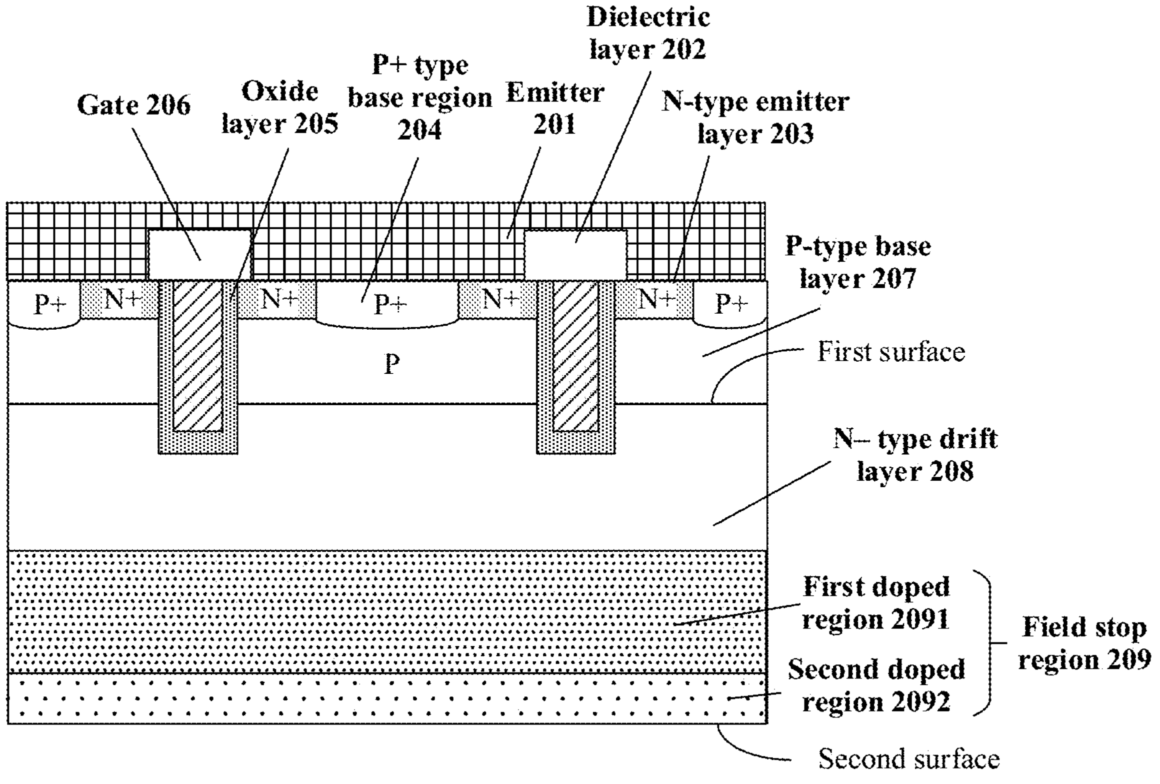
FIG. 5C is a schematic diagram of a structure of another IGBT according to an embodiment of this application.

As shown in FIG. 5C, injection of two kinds of impurity particles may form the first doped region 2091 and the second doped region 2092 at the field stop layer 209, and the N-type substrate between the P-type base layer 207 and the field stop layer 209 may be referred to as the N− type drift layer 208. Compared with the N+ emitter layer 203, the N− type drift layer 208 has a lower doping density of the impurity particle.

A particle radius of the first type impurity particles is smaller than a particle radius of the second type impurity particles, and an injection depth of the first type impurity particles is greater than an injection depth of the second type impurity particles. A depth of the formed first doped region is greater than a depth of the second doped region, where the depth is a distance of the impurity particle relative to the second surface from the field stop layer 209 to the N− type drift layer 208.

The first type impurity particles are hydrogen ions (H+) or a helium ions (He+), and the second type impurity particles are phosphorus atoms, arsenic atoms, both of the two, or the like. After the hydrogen ion (H+) is injected into a semiconductor material, a hole/hydrogen-related complex is formed after an annealing step, and the hydrogen-related complex exists as a donor.

The first injection energy and the second injection energy enable the injection depth of the first type impurity particles to be greater than the injection depth of the second type impurity particles. The first injection energy and/or the second injection energy may be an energy value or may be an energy range. Optionally, the first injection energy is between 50 KeV and 5 MeV, and the second injection energy is between 50 KeV and 5 MeV.

The following describes in detail an injection process of the first type impurity particles and the second type impurity particles. It may be understood that the first type impurity particles or the second type impurity particles may form the doped region in a single-step injection manner or may form the doped region in a multi-step injection manner. This is not limited herein. In addition, there may be no execution sequence between step 403 and step 404, and step 403 and step 404 may be, alternatively, performed simultaneously.

A phosphorus atom (a second impurity particle) and a hydrogen ion (a first impurity particle) are used as examples. However, as noted above, varying elements, ions, and/or compounds may be used for the first type impurity particles and/or the second type impurity particles. When the single-step injection manner is used for both the phosphorus atom and the hydrogen ion, a doping density of the phosphorus atom needs to decrease with a depth, and a doping density of the hydrogen ion increases with a depth, to ensure that the density of the hydrogen ion in a region adjacent to the N− type drift layer 208 is the maximum.

When the multi-step injection manner is used for both the phosphorus atom and the hydrogen ion, the phosphorus atom and the hydrogen ion each correspond to a plurality of injection depths, where the injection density of the phosphorus atom may decrease with the depth. In other words, when the phosphorus atom is injected, an injection dosage may be large at a position having a smaller depth, and an injection dosage may be small at a position having a larger depth. However, for the injection density of the hydrogen ion, the injection density of the first type impurity particles in the region adjacent to the N-type drift layer may be higher than the injection density of the first type impurity particles in any other region.

Figure 7A:
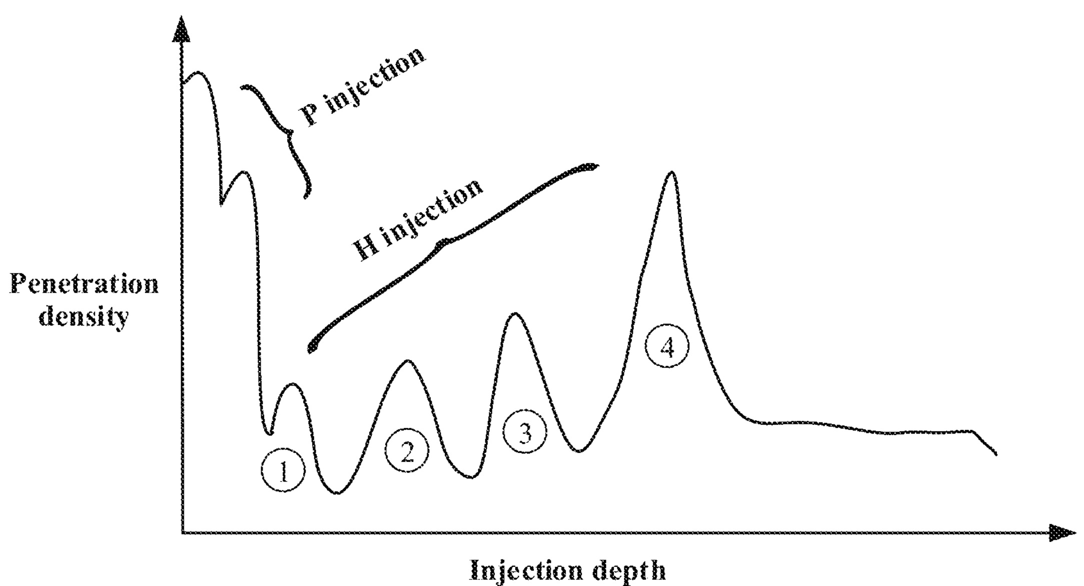
FIG. 7A is a schematic diagram showing distribution of a doping density of an impurity at a field stop layer with a depth according to an embodiment of this application.

FIG. 7A is a schematic diagram showing distribution of a doping density of an impurity particle at a field stop layer with a depth according to an embodiment of this application. As shown in FIG. 7A, the multi-step injection manner is used for both a phosphorus atom and a hydrogen ion, where the hydrogen ion is injected in four steps, and the phosphorus atom is injected in two steps. A depth corresponding to each peak in a curve is an injection depth. It can be seen from the figure that injection depths of the phosphorus atom and the hydrogen ion are different, and an injection density at each injection depth also varies. At each injection depth, there is an injection peak for the injection density of the phosphorus atom. The density corresponding to the injection peak may decrease with an increase of the depth. An injection density of the hydrogen ion also varies with a change of the depth. Specifically, depths corresponding to four peaks are four injection depths, and the four peaks increase with an increase of the injection depths. At a fourth injection depth, the injection density of the hydrogen ion reaches the maximum.

In the hydrogen ion injection process shown in FIG. 7A, the injection density corresponding to the peak close to the N− type drift region is the maximum, and the injection densities corresponding to the remaining peaks are less than the maximum peak. Densities corresponding to the four peaks are respectively marked as ①, ②, ③, and ④, provided that the peak value of ④, is the maximum. For example, the densities corresponding to the four peaks may be ①>②>③, ①=②>③, ①=③>②, ①=②=③, ①<②<③, ②>①>③, ③>①>②, and the like, which are not limited herein, provided that ①, ②, and ③ are all smaller than ④.

Figure 7B:
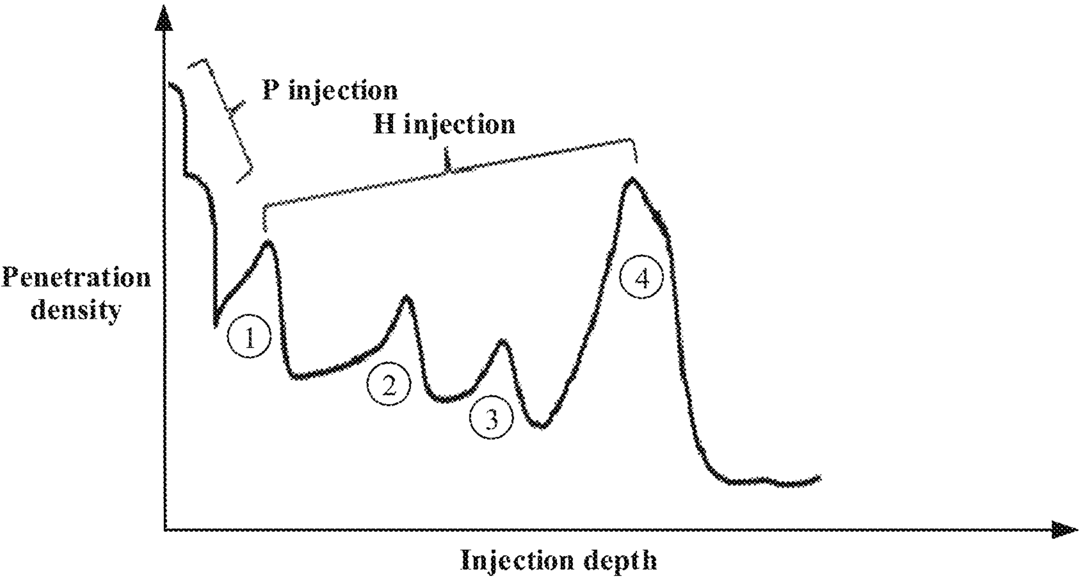
FIG. 7B is a schematic diagram showing another distribution of a doping density of an impurity at a field stop layer with a depth according to an embodiment of this application.

Based on the foregoing description, FIG. 7B is a schematic diagram showing another distribution of a doping density of an impurity particle at a field stop layer with a depth according to an embodiment of this application. In FIG. 7B, the multi-step injection manner may still be used for both a phosphorus atom and a hydrogen ion, where the phosphorus atom is injected in two steps, and the hydrogen ion is injected in four steps. However, an injection density of the hydrogen ion decreases sequentially within a first depth from the field stop layer and then increases from the first depth from the field stop layer with an increase of the depth. At a fourth injection depth, the injection density of the hydrogen ion reaches the maximum. In this way, the electric field strength can also be rapidly reduced, and the peak voltage that exists when the IGBT transistor is turned off can be reduced.

Figures 7C, 8:
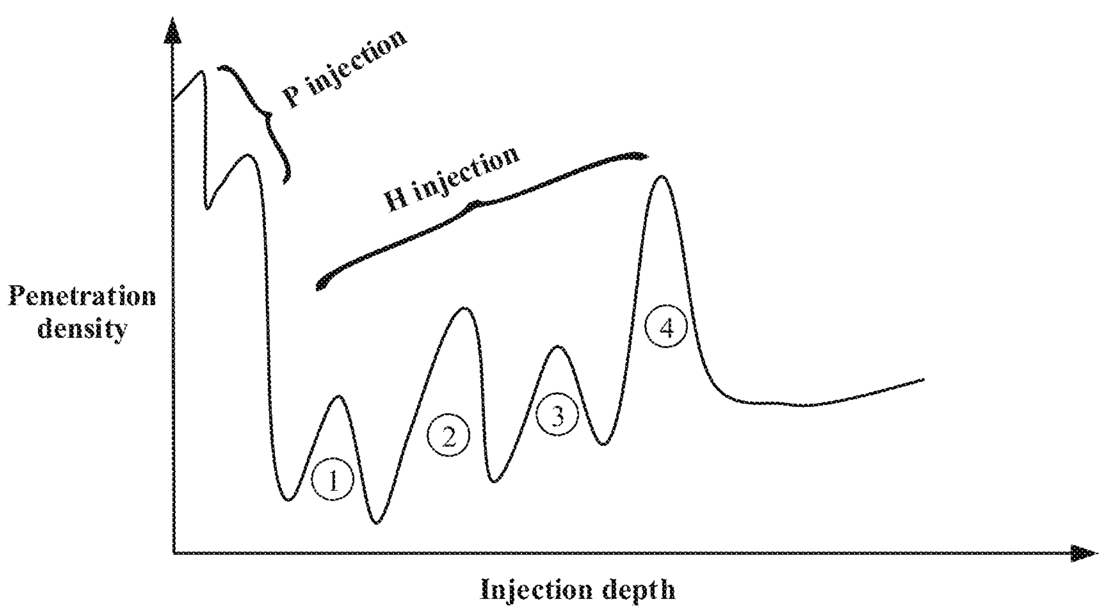
FIG. 7C is a schematic diagram showing another distribution of a doping density of an impurity at a field stop layer with a depth according to an embodiment of this application.
FIG. 8 shows a schematic diagram of an electric field of an IGBT according to an embodiment of this application.

Similarly, FIG. 7C is a schematic diagram showing another distribution of a doping density of an impurity particle at a field stop layer with a depth according to an embodiment of this application. In FIG. 7C, the multi-step injection manner may still be used for both a phosphorus atom and a hydrogen ion, where the phosphorus atom is injected in two steps, and the hydrogen ion is injected in four steps. However, with an increase of the injection depth, an injection density of the hydrogen ion is random at the beginning and the injection density reaches the maximum during injection at the fourth step. In this way, the electric field strength can also be rapidly reduced, and the peak voltage that exists when the IGBT transistor is turned off can be reduced.

Optionally, the injection depth d1 of the first type impurity particles is 5 micrometers to 50 micrometers, and the injection depth d2 of the second type impurity particles is 2 micrometers to 10 micrometers. It should be understood that for a specific impurity particle, larger injection energy indicates a larger injection depth into the N-type substrate, and longer injection duration or a larger injection dosage indicates a larger doping density of the impurity. In this case, the injection depth of the impurity may be controlled by controlling the injection energy, and the doping density may be controlled by controlling the injection duration or the injection dosage.

Optionally, an injection dosage of the first type impurity particles ranges from 5E11 to 1E16, and an injection dosage of the second type impurity particles ranges from 5E11 to 1E16. A dosage is a total quantity of impurity particles that are injected per unit of area and is an integral of the doping density of the impurity particle with respect to a depth.

It should be further understood that different impurity particles have different injection depths in case of same injection energy. A larger particle radius of the impurity particle indicates a smaller injection depth. On the contrary, a smaller particle radius of the impurity particle indicates a larger injection depth. Therefore, if the impurity particle has a smaller particle radius, it is easier to inject the impurity particle into a depth of the N-type substrate. In other words, when particles are injected into a same depth, more energy may be utilized for injecting the helium ion (He+) when compared to the hydrogen ion (H+).

It should be understood that in case of a same width of a field stop layer, compared with a manner of forming a field stop layer by injecting P, in a manner of forming a field stop layer by injecting the hydrogen ion (H+) or the helium ion (He+), a large injection depth may be obtained without large injection energy, and a field stop layer with a large width is more easily obtained.

Optionally, the first injection energy and the injection duration (or the injection dosage) of the first type impurity particles may be controlled, so that more first injection energy leads to a lower doping density of the first type impurity particles. According to this method, the doping density of the first type impurity particles substantially increases in a direction away from the second surface, to implement gradient doping or roughly gradient doping of the first type impurity particles. The gradient doping can reduce voltage stress that exists when the IGBT transistor is turned off and improve voltage resistance. In addition, stress caused by the doping on the N-type substrate can be reduced, and performance and yield of the IGBT can be improved.

Optionally, the second injection energy and the injection duration (or the injection dosage) of the second type impurity particles may be controlled, so that more second injection energy leads to a lower doping density of the second type impurity particles. According to this method, the doping density of the second type impurity particles substantially decreases in the direction away from the second surface, to implement gradient doping or roughly gradient doping of the second type impurity particles. In this way, stress caused by the doping on the N-type substrate is reduced, and the performance and the yield of the IGBT are improved.

Compared with a manner of forming the second doped region through epitaxial growth, in the foregoing manner of injecting the second type impurity particles, preparation costs can be reduced, and preparation efficiency can be improved. In addition, because the first type impurity particles and the second type impurity particles are separately injected, the injection depth of the second type impurity particles is reduced, and a wafer scrap risk can be reduced.

Referring back to FIG. 4, at step 405 includes forming a P+ type collector layer 210 on the second surface.

Figure 5D:
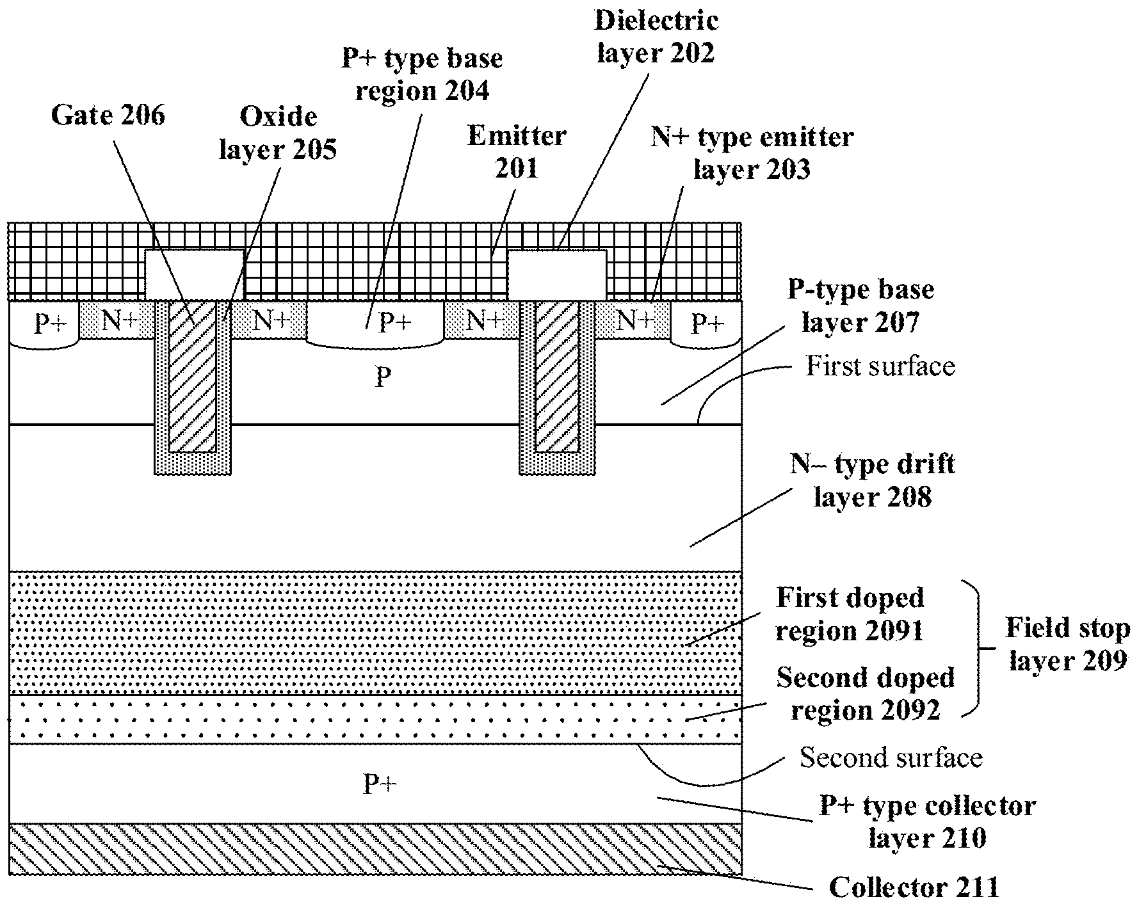
FIG. 5D is a schematic diagram of a structure of another IGBT according to an embodiment of this application.

As shown in FIG. 5D, the P+ type collector layer 210 may be formed through epitaxial growth on the second surface, or the P+ type collector layer 210 may be formed by injecting impurities from the second surface.

At step 406, form a collector 211 on a surface of the P+ type collector layer 210.

In some embodiments, annealing processing may be performed during or after steps 403, 404, 405, or 406. It should be understood that annealing processing may be annealing the N-type substrate into which the first type impurity particles and the second type impurity particles are injected.

In this embodiment of this application, annealing processing may be used to restore a lattice structure and reduce a disadvantage, and may also change an interstitial impurity atom to a substitute impurity atom.

Optionally, the maximum temperature for annealing is 200° C. to 500° C. A reason is as follows: After H+ is injected into silicon (Si), H+ can be immediately combined with an impurity, a disadvantage, and a dangling bond in Si to form a plurality of hydrogen-related complexes (H-related complex). The hole and the hydrogen-related complex form the donor in the field stop region. A doping density depends on a quantity of donors per unit of volume. The distribution of the hole and the hydrogen-related complex is almost unchanged when annealing is performed at approximately 200° C.

It may be understood that, when the P atom is deeply injected into the field stop layer, a high annealing temperature may be utilized. However, for an IGBT whose field stop layer is formed by injecting P, the high annealing temperature may destroy the MOSFET structure on the front surface of the N-type substrate. According to the IGBT whose field stop layer is formed by injecting both H and P and that is provided in this embodiment of this application, an injection depth of P is shallow, and a very high annealing temperature is not required. Therefore, the MOSFET structure on the front surface of the N-type substrate can be prevented from being damaged. In addition, a decrease of a large quantity of beneficial disadvantages introduced by injecting H+ can be avoided, and the collector-emitter leakage current of the IGBT can be reduced.

FIG. 8 is a schematic diagram of an electric field of an IGBT according to an embodiment of this application. It can be seen from FIG. 8 that a slope of an electric field curve corresponding to a field stop region gradually decreases, so that voltage intensity rapidly decreases at the field stop region. In this way, an excessively high peak voltage is not generated. This avoids the excessively high peak voltage and prevents the IGBT itself or other components in a circuit from being broken down and damaged due to overvoltage.

Figure 9:
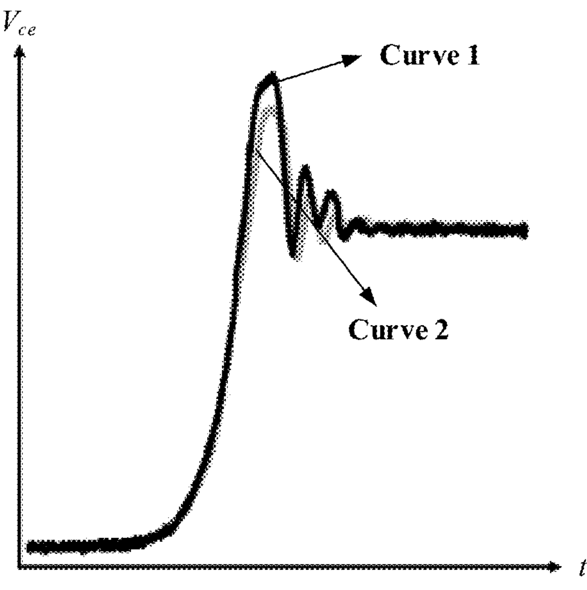
FIG. 9 is a voltage transformation diagram of a peak voltage corresponding to an IGBT according to an embodiment of this application.

FIG. 9 is a voltage change diagram corresponding to an IGBT according to an embodiment of this application. As shown in the figure, curve 1 is a voltage curve that appears when another IGBT transistor is turned off, and curve 2 is a voltage curve that appears when the IGBT transistor in this embodiment of this application is turned off, where voltage values corresponding to peaks on curves 1 and 2 are peak voltage values. It can be seen from FIG. 9 that a peak voltage that is generated when the IGBT transistor in this embodiment of this application is turned off obviously decreases, and performance of the IGBT transistor is effectively improved.

Finally, in an application process, the IGBT device may be packaged into a power module, such as an IGBT discrete device, an IGBT module, and an intelligent power module (IPM). The IGBT discrete device may be a single-tube IGBT or may be a device including a single-tube IGBT and an anti-parallel diode. The IGBT module is obtained by assembling a plurality of IGBT chips and diode chips into a DBC substrate through insulation and then performing encapsulation. The IPM is a “composite” device that integrates a power device such as an IGBT with a peripheral circuit such as a drive circuit, an overvoltage and overcurrent protection circuit, and a temperature monitoring and overtemperature protection circuit.

The technical terms used in the embodiments of the present disclosure are merely used to describe specific embodiments, but are not intended to limit the present disclosure. In this specification, singular forms “one”, “this”, and “the” are intended to simultaneously include plural forms unless otherwise clearly specified in the context. Further, the term “including” and/or “containing” used in this specification refers to presence of features, entirety, steps, operations, elements and/or components, but does not exclude presence or addition of one or more other features, entirety, steps, operations, elements and/or components.

In the appended claims, the corresponding structures, materials, actions, and equivalence forms (if any) of all apparatuses or steps and functional elements are intended to include any structure, material, or action that is used to perform the function with reference to other explicitly required elements. The descriptions of the present disclosure are given for the purposes of the embodiments and the descriptions, but are not intended to be exhaustive or limit the present disclosure to the disclosed form.

What is claimed is:

1. A semiconductor device, comprising:

an N-type drift layer and an N-type field stop layer adjacent to the N-type drift layer, wherein: a density of free electrons at the N-type field stop layer is higher than a density of free electrons at the N-type drift layer, the N-type field stop layer comprises first type impurity particles and second type impurity particles doped with the first type impurity particles, and a radius of the second type impurity particles is greater than a radius of the first type impurity particles, in the N-type field stop layer, an injection density of the first type impurity particles in a region adjacent to the N-type drift layer is higher than an injection density of the first type impurity particles in any other region, and the injection density peaks of the first type impurity particles increase sequentially along the field stop layer to the N type drift layer; and within a first injection depth of the first type impurity particles in the N-type field stop layer, there are two or more density peaks of the first type impurity particles and within a second injection depth of the second type impurity particles in the N-type field stop layer, there are two or more density peaks of the second type impurity particles, the first injection depth being larger than the second injection depth.

2. The semiconductor device according to claim 1, wherein the first type impurity particles are hydrogen ions or helium ions and the second type impurity particles are phosphorus atoms or arsenic atoms.

3. The semiconductor device according to claim 1, wherein the first type impurity particles form a first doped region, the second type impurity particles form a second doped region, and a thickness of the first doped region is greater than a thickness of the second doped region.

4. The semiconductor device according to claim 1, wherein the semiconductor device further comprises:

a P-type collector layer disposed on a surface of the field stop layer that faces away from the N-type drift layer;

a P-type base layer disposed on a surface of the N-type drift layer that faces away from the field stop layer;

an N-type emitter layer disposed on a surface of the P-type base layer that faces away from the N-type drift layer; and a gate connected to the P-type base layer through an oxide layer.

5. The semiconductor device according to claim 4, wherein:

the gate penetrates the N-type emitter layer and the P-type base layer; or the gate is disposed on the surface of the P-type base layer that faces away from the N-type drift layer.

6. A power module, comprising:

at least one semiconductor device, a diode device, and a substrate, wherein the at least one semiconductor device comprises:

an N-type drift layer and an N-type field stop layer adjacent to the N-type drift layer, wherein a density of free electrons at the N-type field stop layer is higher than a density of free electrons at the N-type drift layer, the N-type field stop layer comprises first type impurity particles and second type impurity particles doped with the first type impurity particles, and a radius of the second type impurity particles is greater than a radius of the first type impurity particles, in the N-type field stop layer, an injection density of the first type impurity particles in a region adjacent to the N-type drift layer is higher than an injection density of the first type impurity particles in any other region, and the injection density peaks of the first type impurity particles increase sequentially along the field stop layer to the N type drift layer;

within a first injection depth of the first type impurity particles in the N-type field stop layer, there are two or more density peaks of the first type impurity particles and within a second injection depth of the second type impurity particles in the N-type field stop layer, there are two or more density peaks of the second type impurity particles, the first injection depth being larger than the second injection depth, and the at least one semiconductor device and the diode device are connected in parallel, the at least one semiconductor device and the diode device are insulated from each other, and the substrate is used to package the at least one semiconductor device and the diode device.

7. The power module according to claim 6, wherein the first type impurity particles are hydrogen ions or helium ions, and the second type impurity particles are phosphorus atoms or arsenic atoms.

8. The power module according to claim 6, wherein the first type impurity particles form a first doped region, the second type impurity particles form a second doped region, and a thickness of the first doped region is greater than a thickness of the second doped region.

9. The power module according to claim 6, the semiconductor device further comprises:

a P-type collector layer disposed on a surface of the field stop layer that faces away from the N-type drift layer;

a P-type base layer disposed on a surface of the N-type drift layer that faces away from the field stop layer;

an N-type emitter layer disposed on a surface of the P-type base layer that faces away from the N-type drift layer; and a gate connected to the P-type base layer through an oxide layer.

10. The power module according to claim 9, wherein:

the gate penetrates the N-type emitter layer and the P-type base layer; or the gate is disposed on the surface of the P-type base layer that faces away from the N-type drift layer.

* * * * *